United States Patent
Cheng (10) Patent No.: US 12,267,058 B1
(45) Date of Patent: Apr. 1, 2025

(54) ADAPTIVE-BIAS MOS IMPEDANCE FOR REDUCED-AREA RC FILTER

(71) Applicant: Ambarella International LP, Santa Clara, CA (US)

(72) Inventor: Yueh Chun Cheng, Cupertino, CA (US)

(73) Assignee: Ambarella International LP, Santa Clara, CA (US)

( * ) Notice: Subject to any disclaimer, the term of this patent is extended or adjusted under 35 U.S.C. 154(b) by 299 days.

(21) Appl. No.: 17/942,093

(22) Filed: Sep. 9, 2022

(51) Int. Cl.
*G05F 3/26* (2006.01)
*H03H 7/01* (2006.01)

(52) U.S. Cl.
CPC .......... *H03H 7/0153* (2013.01); *G05F 3/262* (2013.01)

(58) Field of Classification Search
CPC .............................. H02H 7/0153; G05F 3/262
See application file for complete search history.

(56) References Cited

U.S. PATENT DOCUMENTS

| | | | |
|---|---|---|---|
| 11,353,903 B1 * | 6/2022 | Coban | G05F 1/445 |
| 11,614,763 B1 * | 3/2023 | Bhatta | G05F 1/461 |
| | | | 327/313 |
| 2020/0336141 A1 * | 10/2020 | S | H03K 17/302 |
| 2021/0149424 A1 * | 5/2021 | Chauhan | G05F 1/468 |

* cited by examiner

*Primary Examiner* — Adolf D Berhane
(74) *Attorney, Agent, or Firm* — Maiorana Patent Law, PA (57) ABSTRACT

An adaptive-bias metal-oxide-semiconductor (MOS) device comprises a first terminal, a second terminal, a third terminal, a first MOS device, and a second MOS device. The first MOS device generally may have a first width and a first gate length. The second MOS device generally may have a second width and a second gate length. The first terminal may be connected to a first source terminal of the first MOS device and a second source terminal of the second MOS device. The second terminal may be connected to a first drain terminal of the first MOS device, a first gate terminal of the first MOS device, and a second gate terminal of the second MOS device. The third terminal may be connected to a second drain terminal of the second MOS device. The first MOS device and the second MOS device are generally configured to operate in a sub-threshold operating region.

19 Claims, 8 Drawing Sheets

ADAPTIVE-BIAS MOS IMPEDANCE FOR REDUCED-AREA RC FILTER

FIELD OF THE INVENTION

The invention relates to resistive-capacitive (RC) filters generally and, more particularly, to a method and/or apparatus for implementing an adaptive-bias metal-oxide-semiconductor (MOS) impedance for a reduced-area resistive-capacitive (RC) filter.

BACKGROUND

Integrated circuit and system-on-chip (SoC) devices generally include bias voltage and reference voltage generating circuits. Bias voltage and reference voltage generating circuits generally include resistive-capacitive (RC) filters to filter supply and device noise. To filter supply and device noise with a frequency greater than 16 kHz, a large capacitance (e.g., C=~10 pF) and a large resistance (e.g., R>1 MΩ) are needed. A 1 MΩ resistor implemented in CMOS technology (e.g., with minimum width 0.21 µm in Samsung 4 nm process) has a large area (e.g., ~190 µm^2). An integrated circuit device and/or a system-on-chip (SoC) device can have many critical bias and reference voltage nodes. A resistor occupying a large chip area at each critical bias and reference voltage node of an integrated circuit device and/or a system-on-chip (Soc) device is prohibitively expensive.

It would be desirable to implement an adaptive-bias metal-oxide-semiconductor (MOS) impedance for a reduced-area resistive-capacitive (RC) filter.

SUMMARY

The invention concerns an adaptive-bias metal-oxide-semiconductor (MOS) device comprising a first terminal, a second terminal, a third terminal, a first MOS device, and a second MOS device. The first MOS device may have a first width and a first gate length. The second MOS device may have a second width and a second gate length. The first terminal may be connected to a first source terminal of the first MOS device and a second source terminal of the second MOS device. The second terminal may be connected to a first drain terminal of the first MOS device, a first gate terminal of the first MOS device, and a second gate terminal of the second MOS device. The third terminal may be connected to a second drain terminal of the second MOS device. The first MOS device and the second MOS device are generally configured to operate in a sub-threshold operating region.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing an adaptive-bias metal-oxide-semiconductor (MOS) impedance for a reduced-area resistive-capacitive (RC) filter that may (i) replace a large (e.g., ~190 µm^2) resistor in a low pass filter with a significantly smaller (e.g., ~1 µm^2) MOS device to reduce die area, (ii) be utilized to filter supply noise and/or device flicker/thermal noise, (iii) implement a MOS device operating in a sub-threshold region (Vgs<Vth), (iv) be implemented as part of a bias voltage generating circuit, (v) be implemented as part of a reference voltage generating circuit, and/or (vi) be implemented as one or more integrated circuits.

Figure 1A:
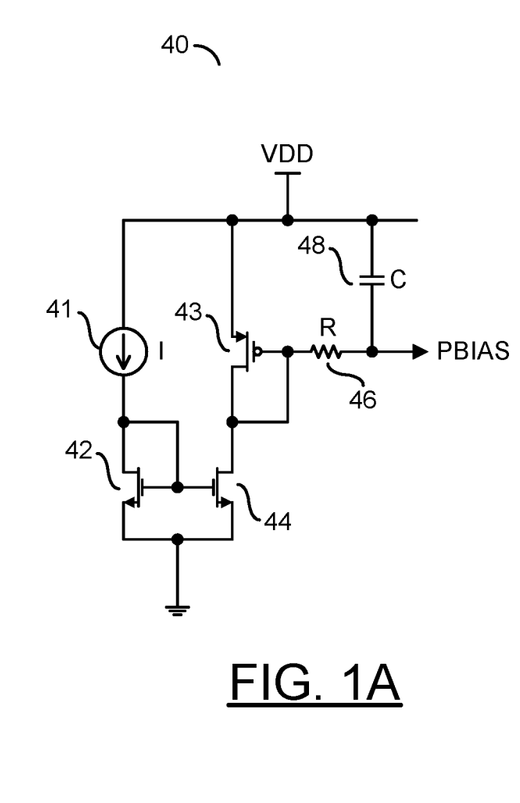
FIGS. 1A-1C are diagrams illustrating bias voltage and reference voltage generating circuits using a resistor and a capacitor configured as a low-pass RC filter.
Figure 1B:
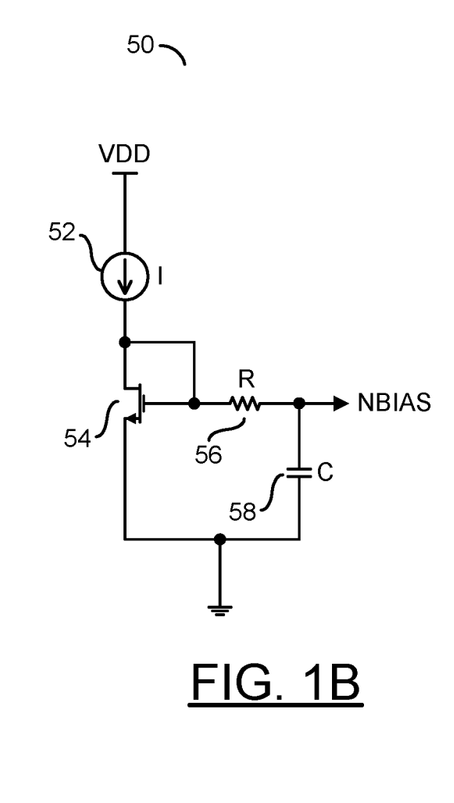
Figure 1C:
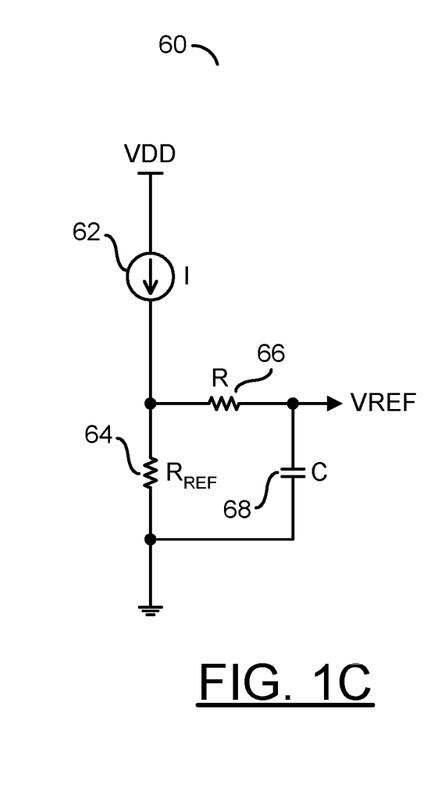

Referring to FIGS. 1A-1C, diagrams are shown illustrating bias voltage and reference voltage generating circuits using a resistor and a capacitor as a low-pass filter. Bias voltage and reference voltage generating circuits generally include resistive-capacitive (RC) filters to filter supply and device noise. In an example, a circuit 40 (FIG. 1A) may be implemented to generate a p-channel bias voltage (e.g., PBIAS), a circuit 50 (FIG. 1B) may be implemented to generate a n-channel bias voltage (e.g., NBIAS), and a circuit 60 (FIG. 1C) may be implemented to generate a reference voltage (e.g., VREF). In an example, the circuit 40, the circuit 50, and the circuit 60 may include a resistive-capacitive (RC) filter to filter supply and device noise. To filter supply and device noise with a frequency greater than 16 kHz, a large capacitance (e.g., C=~10 pF) and a large resistance (e.g., R>1 MΩ) are needed. A 1 MΩ resistor implemented in CMOS technology (e.g., with minimum width 0.21 µm metal trace in Samsung 4 nm process) has a large area (e.g., ~190 µm^2). An integrated circuit device and/or a system-on-chip (SoC) device can have many critical bias and reference voltage nodes. A resistor occupying a large chip area at each critical bias and/or reference voltage node of an integrated circuit device and/or a system-on-chip (SOC) device is prohibitively expensive.

Referring to FIG. 1A, the circuit 40 may comprise a current source 41, an n-channel metal-oxide-semiconductor (NMOS) transistor 42, a p-channel metal-oxide-semiconductor (PMOS) transistor 43, an NMOS transistor 44, a resistor 46, and a capacitor 48. The current source 41 is generally configured to generate a current (e.g., I). In an example, the current source 41 may be implemented as a constant current source (e.g., a bandgap-based current source). The transistor 42 and the transistor 44 may be configured as a current mirror. The transistor 44 mirrors the current I received by the transistor 42 from the current source 41. The transistor 43 may generate the bias voltage PBIAS having a level that corresponds to the transistor 43 having a drain current (e.g., $I_d$) equal to the current I mirrored by the transistor 44. The resistor 46 and the capacitor 48 are generally configured to implement a low-pass resistive-capacitive (RC) filter. In an example, the resistor 46 may be implemented as a large value resistance (e.g., R>1 MΩ) and the capacitor 48 may be implemented as a large value capacitance (e.g., C=~10 pF) to filter supply and device noise with a frequency greater than 16 kHz.

In an example, a supply voltage (e.g., VDD) may be presented to an input of the current source 41, a source terminal of the transistor 43, and a first terminal of the capacitor 48. An output of the current source 41, may be connected to a drain terminal of the transistor 42, a gate terminal of the transistor 42, and a gate terminal of the transistor 44. A source terminal of the transistor 42 and a source terminal of the transistor 44 may be connected to a circuit ground potential. A drain terminal of the transistor 43, may be connected to a drain terminal of the transistor 44, a gate terminal of the transistor 43, and a first terminal of the resistor 46. A second terminal of the resistor 46 and a second terminal of the capacitor 48 may be connected to form a node at which the signal PBIAS may be presented.

Referring to FIG. 1B, the circuit 50 may comprise a current source 52, an NMOS transistor 54, a resistor 56, and a capacitor 58. The current source 52 is generally configured to generate a current (e.g., I). In an example, the current source 52 may be implemented as a constant current source (e.g., a bandgap-based current source). The transistor 54 may be configured to generate the voltage NBIAS in response to the current I provided by the current source 52. The resistor 56 and the capacitor 58 are generally configured to implement a low-pass RC filter. In an example, the resistor 56 may be implemented as a large value resistance (e.g., R>1 MΩ) and the capacitor 58 may be implemented as a large value capacitance (e.g., C=~10 pF) to filter supply and device noise with a frequency greater than 16 kHz. In an example, the supply voltage VDD may be presented to an input of the current source 52. An output of the current source 52, may be connected to a drain terminal of the transistor 54, a gate terminal of the transistor 54, and a first terminal of the resistor 56. A source terminal of the transistor 54 and a first terminal of the capacitor 58 may be connected to the circuit ground potential. A second terminal of the resistor 56 and a second terminal of the capacitor 58 may be connected to form a node at which the signal NBIAS may be presented.

Referring to FIG. 1C, the circuit 60 may comprise a current source 62, a first resistor 64, a second resistor 66, and a capacitor 68. The current source 62 is generally configured to generate a current (e.g., I). In an example, the current source 62 may be implemented as a bandgap-based current source. The first resistor 64 may be implemented having a resistance value $R_{REF}$. The resistance value $R_{REF}$ of the resistor 64 is generally configured to generate the reference voltage VREF in response to the current I provided by the current source 62 (e.g., VREF=$IR_{REF}$). The current I provided by the current source 62 generally follows (tracks) process variations of the resistor 64 such that VREF=$IR_{REF}$ is constant. The second resistor 66 and the capacitor 68 are generally configured to implement a low-pass RC filter. In an example, the second resistor 66 may be implemented as a large value resistance (e.g., R>1 MΩ) and the capacitor 68 may be implemented as a large value capacitance (e.g., C=~10 pF) to filter supply and device noise with a frequency greater than 16 kHz. In an example, the supply voltage VDD may be presented to an input of the current source 62. An output of the current source 62, may be connected to a first terminal of the first resistor 64 and a first terminal of the second resistor 66. A second terminal of the first resistor 64 and a first terminal of the capacitor 68 may be connected to the circuit ground potential. A second terminal of the resistor 66 and a second terminal of the capacitor 68 may be connected to form a node at which the signal VREF may be presented.

Figure 2A:
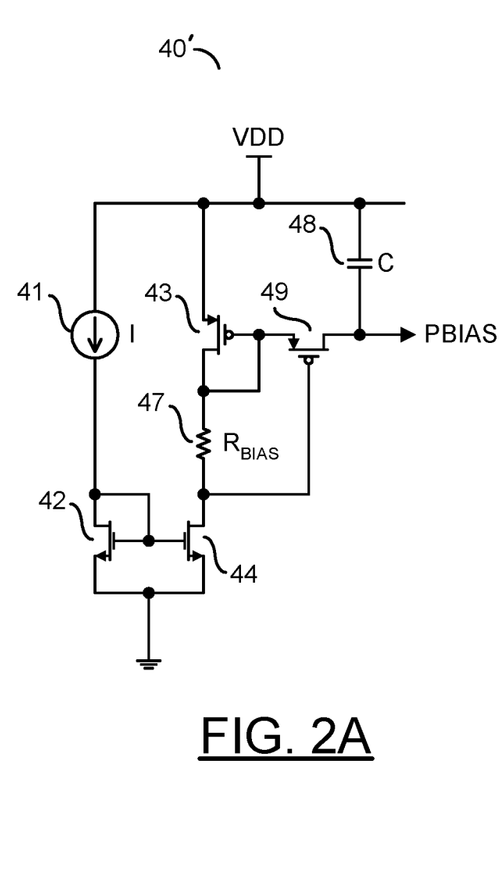
FIGS. 2A-2C are diagrams illustrating bias voltage and reference voltage generating circuits using an IR-biased active metal-oxide-semiconductor (MOS) transistor and a capacitor as a low-pass RC filter.
Figure 2B:
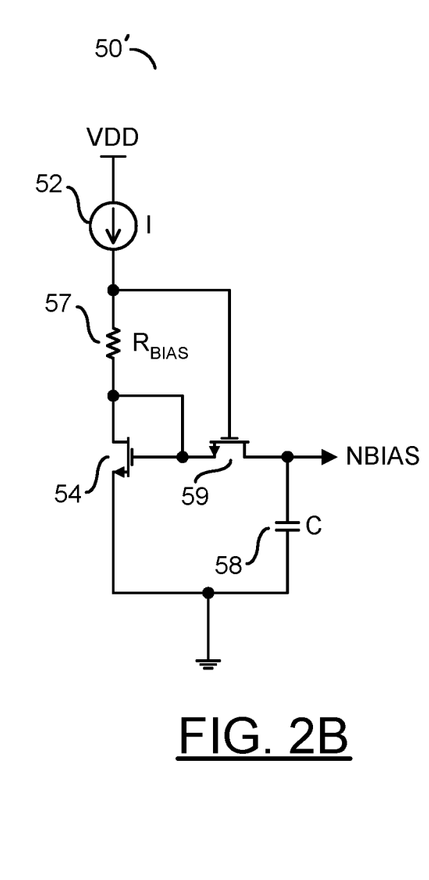
Figure 2C:
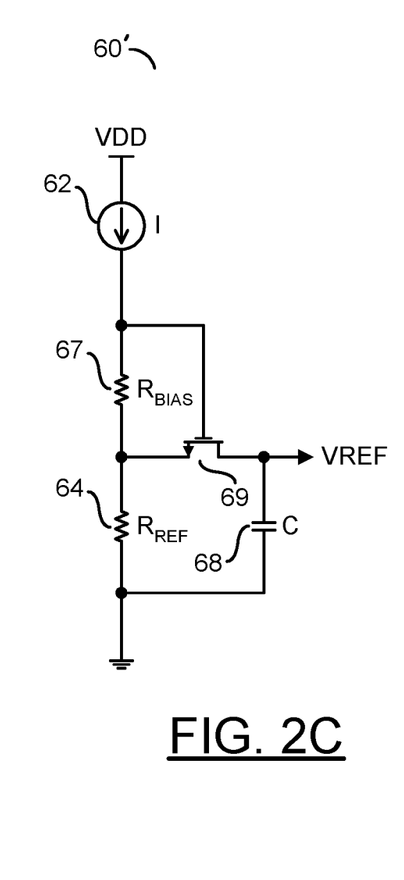

Referring to FIGS. 2A-2C, diagrams are shown illustrating bias voltage and reference voltage generating circuits using an active metal-oxide-semiconductor (MOS) transistor and a capacitor as a low-pass filter. In an example, a circuit 40' (FIG. 2A) may be implemented to generate a p-channel bias voltage (e.g., PBIAS), a circuit 50' (FIG. 2B) may be implemented to generate a n-channel bias voltage (e.g., NBIAS), and a circuit 60' (FIG. 2C) may be implemented to generate a reference voltage (e.g., VREF). In an example, the circuit 40', the circuit 50', and the circuit 60' may include a resistive-capacitive (RC) filter utilizing an IR-biased active metal-oxide-semiconductor (MOS) transistor and capacitor to filter supply and device noise. To filter supply and device noise with a frequency greater than 16 kHz, a large capacitance (e.g., ~10 pF) and a large resistance (e.g., >1 MΩ) are needed.

Referring to FIG. 2A, the circuit 40' may comprise the current source 41, the n-channel metal-oxide-semiconductor (NMOS) transistor 42, the p-channel metal-oxide-semiconductor (PMOS) transistor 43, the NMOS transistor 44, a resistor 47, the capacitor 48, and a PMOS transistor 49. In an example, a supply voltage (e.g., VDD) may be presented to an input of the current source 41, a source terminal of the transistor 43, and a first terminal of the capacitor 48. An output of the current source 41, may be connected to a drain terminal of the transistor 42, a gate terminal of the transistor 42, and a gate terminal of the transistor 44. A source terminal of the transistor 42 and a source terminal of the transistor 44 may be connected to a circuit ground potential. A drain terminal of the transistor 43, may be connected to a gate terminal of the transistor 43, a source terminal of the transistor 49, and a first terminal of the resistor 47. A second terminal of the resistor 47 may be connected to a drain terminal of the transistor 44 and a gate terminal of the transistor 49. A drain terminal of the transistor 49 and a second terminal of the capacitor 48 may be connected to form a node at which the signal PBIAS may be presented.

The current source 41 generally provides a current I. In an example, the current source 41 may be implemented as a constant current source (e.g., a bandgap-based current source). The transistor 42 and the transistor 44 may be configured as a current mirror. The transistor 44 mirrors the current I received by the transistor 42 from the current source 41. The transistor 43 may generate the bias voltage PBIAS having a level that corresponds to the transistor 43 having a drain current (e.g., $I_d$) equal to the current I mirrored by the transistor 44. In an example, the resistor 47 has a resistance value $R_{BIAS}$ that is generally configured to set a gate-source voltage (e.g., $V_{gs}$) of the transistor 49 to a level lower than a threshold voltage (e.g., $V_{th}$) of the transistor 49 in order to maintain the transistor 49 in a sub-threshold operating region (e.g., $IR_{BIAS}=V_{gs}<V_{th}$). In an example, the resistor 47 may have a resistance value of About 11.65 kΩ. In an example, the capacitor 48 may be implemented as a large value capacitance (e.g., C=~10 pF).

The capacitor 48 and a drain-source impedance (e.g., $R_{ds}$) of the transistor 49 are generally configured to implement a low-pass RC filter.

When the transistor 49 is operating in the sub-threshold region, the drain-source impedance $R_{ds}$ of the transistor 49 is large (e.g., approximately a megaohm (MΩ)). However, the process of the resistor 47 generally does not track the process of the transistor 49. In an example, $V_{gs}$-Vth may vary too much (e.g., from −322 mV to about −136 mV) to achieve a drain-source voltage (e.g., $V_{ds}$) drop that is approximately zero volts. A range of the drain-source impedance $R_{ds}$ of the transistor 49 is generally too large (e.g., 20 kΩ to about 1.2 GΩ) over process, voltage, and temperature (PVT). Low frequency noise cannot be filtered out when the drain-source impedance $R_{ds}$ of the transistor 49 is not large enough (e.g., less than a MΩ) or when a settling time is too long due to the drain-source impedance $R_{ds}$ of the transistor 49 being too large (e.g., greater than a GΩ).

Referring to FIG. 2B, the circuit 50' may comprise the current source 52, the NMOS transistor 54, a resistor 57, the capacitor 58, and a NMOS transistor 59. In an example, the supply voltage VDD may be presented to an input of the current source 52. An output of the current source 52, may be connected to a first terminal of the resistor 57 and a gate terminal of the transistor 59. A second terminal of the resistor 57 may be connected to a drain terminal of the transistor 54, a gate terminal of the transistor 54, and a source terminal of the transistor 59. A source terminal of the transistor 54 and a first terminal of the capacitor 58 may be connected to the circuit ground potential. A drain terminal of the transistor 59 and a second terminal of the capacitor 58 may be connected to form a node at which the signal NBIAS may be presented.

The current source 52 generally provides a current I. In an example, the current source 52 may be implemented as a constant current source (e.g., a bandgap-based current source). The transistor 54 may generate the bias voltage NBIAS having a level that corresponds to the transistor 54 having a drain current (e.g., $I_d$) equal to the current I. In an example, the resistor 57 has a resistance value $R_{BIAS}$ that is generally configured to set a gate-source voltage (e.g., $V_{gs}$) of the transistor 59 to a level lower than a threshold voltage (e.g., $V_{th}$) of the transistor 59 in order to maintain the transistor 59 in a sub-threshold operating region (e.g., $IR_{BIAS}=V_{gs}<V_{th}$). In an example, the capacitor 58 may be implemented as a large value capacitance (e.g., C=~10 pF). The capacitor 58 and a drain-source impedance (e.g., $R_{ds}$) of the transistor 59 are generally configured to implement a low-pass RC filter.

When the transistor 59 is operating in the sub-threshold region, the drain-source impedance $R_{ds}$ of the transistor 59 is large (e.g., approximately a megaohm (MΩ)). However, the process of the resistor 57 generally does not track the process of the transistor 59. In an example, a difference (e.g., $V_{gs}-V_{th}$) between the gate-source voltage $V_{gs}$ and the threshold voltage $V_{th}$ of the transistor 59 may vary too much to achieve a drain-source voltage (e.g., $V_{ds}$) drop that is approximately zero volts. Low frequency noise cannot be filtered out when the drain-source impedance $R_{ds}$ of the transistor 59 is not large enough (e.g., less than a MΩ) or when a settling time is too long due to the drain-source impedance $R_{ds}$ of the transistor 59 being too large (e.g., greater than a GΩ).

Referring to FIG. 2C, the circuit 60' may comprise the current source 62, the first resistor 64, a second resistor 67, the capacitor 68, and an NMOS transistor 69. In an example, the supply voltage VDD may be presented to an input of the current source 62. An output of the current source 62, may be connected to a first terminal of the second resistor 67 and a gate terminal of the transistor 69. A second terminal of the second resistor 67 may be connected a first terminal of the first resistor 64 and a source terminal of the transistor 69. A second terminal of the first resistor 64 and a first terminal of the capacitor 68 may be connected to the circuit ground potential. A drain terminal of the transistor 69 and a second terminal of the capacitor 68 may be connected to form a node at which the signal VREF may be presented.

The current source 62 generally provides a current I. In an example, the current I may be based on a bandgap voltage. The current I generally passes through the resistor 64 and the resistor 67. The first resistor 64 may be implemented having a resistance value $R_{REF}$. The resistance value $R_{REF}$ of the resistor 64 is generally configured to generate the reference voltage VREF in response to the current I provided by the current source 62 (e.g., VREF=$IR_{REF}$). The current I generally follows process variations of the resistor 64 such that VREF=$IR_{REF}$ is constant. In an example, the resistor 67 may have a resistance value $R_{BIAS}$ that is generally configured to set a gate-source voltage (e.g., $V_{gs}$) of the transistor 69 to a level lower than a threshold voltage (e.g., $V_{th}$) of the transistor 69 in order to maintain the transistor 69 in a sub-threshold operating region (e.g., $IR_{BIAS}=V_{gs}<V_{th}$). In an example, the capacitor 68 may be implemented as a large capacitance (e.g., C=~10 pF). The capacitor 68 and a drain-source impedance (e.g., $R_{ds}$) of the transistor 69 are generally configured to implement a low-pass RC filter.

When the transistor 69 is operating in the sub-threshold region, the drain-source impedance $R_{ds}$ of the transistor 69 is large (e.g., greater than a megaohm (MΩ)). However, the process of the resistor 67 generally does not track the process of the transistor 69. In an example, a difference (e.g., $V_{gs}-V_{th}$) between the gate-source voltage $V_{gs}$ and the threshold voltage $V_{th}$ of the transistor 69 may vary too much to achieve a drain-source voltage (e.g., $V_{ds}$) drop that is approximately zero volts. Because the process of the resistor 67 generally does not track the process of the transistor 69, a range of the drain-source impedance $R_{ds}$ of the transistor 69 may be too large over process. Low frequency noise cannot be filtered out when the drain-source impedance $R_{ds}$ of the transistor 69 is not large enough (e.g., less than a MΩ) or when a settling time is too long due to the drain-source impedance $R_{ds}$ of the transistor 69 being too large (e.g., greater than a GΩ).

Figure 3A:
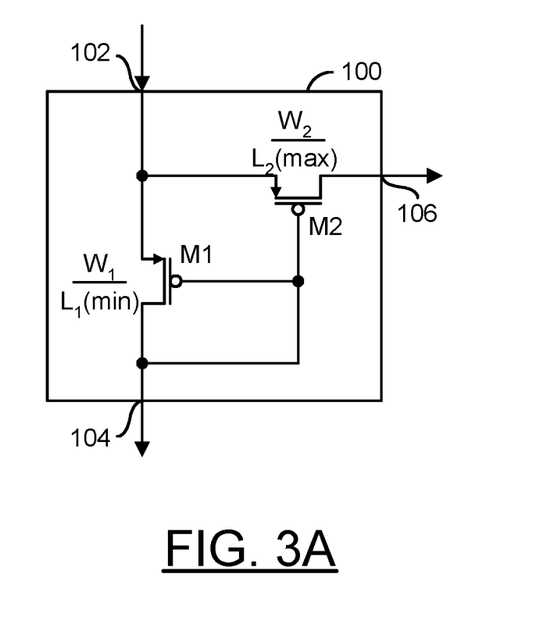
FIGS. 3A and 3B are diagrams illustrating adaptive-bias metal-oxide-semiconductor (MOS) devices in accordance with embodiments of the invention.
Figure 3B:
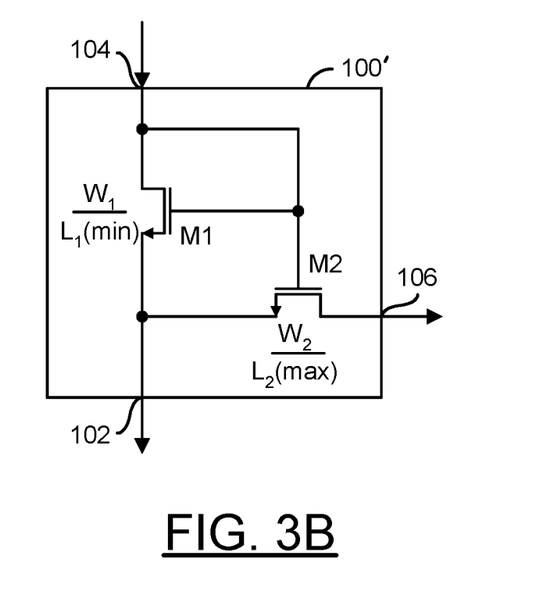

Referring to FIGS. 3A and 3B, diagrams are shown illustrating adaptive-bias metal-oxide-semiconductor (MOS) devices in accordance with embodiments of the invention. In an example, an adaptive-bias metal-oxide-semiconductor (MOS) device in accordance with an embodiment of the invention may comprise a first terminal 102, a second terminal 104, a third terminal 106, a first MOS device M1, and a second MOS device M2. The first MOS device M1 may have a first width (e.g., W1) and a first gate length (e.g., L1). The second MOS device M2 may have a second width (e.g., W2) and a second gate length (e.g., L2). In an example, the second MOS device M2 may comprise a plurality of MOS devices connected in series. In various embodiments, the first gate length L1 may be a minimum gate length (e.g., $L_{min}$) of the process technology and the second gate length L2 may be a maximum gate length (e.g., $L_{max}$) of the process technology.

The first terminal 102 may be connected to a source terminal of the first MOS device M1 and a source terminal of the second MOS device M2. The second terminal 104 may be connected to a drain terminal of the first MOS device M1, a gate terminal of the first MOS device M1, and a gate terminal of the second MOS device M2. The third terminal 106 may be connected to a drain terminal of the second MOS device M2. In an example, a circuit 100 (FIG. 3A) may implement an adaptive-bias p-channel metal-oxide-semiconductor (PMOS) device in accordance with an embodiment of the invention and a circuit 100' (FIG. 3B) may implement an adaptive-bias n-channel metal-oxide-semiconductor (NMOS) device in accordance with an embodiment of the invention.

In various embodiments, an adaptive-bias metal-oxide-semiconductor (MOS) device in accordance with embodiments of the invention is generally configured such that the MOS device M2 presents a large drain-source impedance $R_{ds}$. In order for the large drain-source impedance $R_{ds}$ of the MOS device M2 to reach megaohm level, two criteria need to be met: the MOS device M2 needs to be operating in the sub-threshold operating region (e.g., $V_{gs2}<V_{th2}$) and the ratio of the width W2 of the MOS device M2 to the gate length L2 of the MOS device M2 (e.g., W2/L2) needs to be small. To have the MOS device M2 operating in the sub-threshold region, the ratio of the width W1 of the MOS device M1 to the gate length L1 of the MOS device M1 (e.g., W1/L1) is made large to get the MOS device M1 operating in the sub-threshold region (e.g., $V_{gs1}<V_{th1}$). In an example, the gate length L1 of the MOS device M1 is chosen to be the minimum gate length (e.g., 0.07 μm) so that the width W1 of the MOS device M1 may be a reasonable size to save die area. The gate length L2 of MOS device M2 is chosen to be greater than the gate length L1 of the MOS device M1 so the threshold voltage $V_{th1}$ of the MOS device M1 is less than the threshold voltage $V_{th2}$ of the MOS device M2 (e.g., a larger gate length results in a larger threshold voltage) and the gate-source voltage $V_{gs2}$ is less than the threshold voltage $V_{th2}$ of the MOS device M2, resulting in the MOS device M2 operating in the sub-threshold operating region. In order for the ratio W2/L2 to be small, the width W2 of the MOS device M2 is chosen to be small (e.g., 4 fins, where 3 fins is the minimum width) and the gate length L2 is chosen to be the maximum gate length (e.g., 0.2 μm). In general, as the ratio of width to gate length (e.g., W/L) of a MOS device decreases, the drain-source impedance $R_{ds}$ of the MOS device increases.

When the gate length L1 of the MOS device M1 is smaller than the gate length L2 of the MOS device M2, a threshold voltage (e.g., $V_{th1}$) of the MOS device M1 is smaller than a threshold voltage (e.g., $V_{th2}$) of the MOS device M2. By configuring the MOS device M2 with the maximum gate length (L2(max)) and the MOS device M1 with the minimum gate length (e.g., L1(min)), the threshold voltage $V_{th1}$ of the MOS device M1 is ensured to be smaller than the threshold voltage $V_{th2}$ of the MOS device M2. By configuring the width W2 of the MOS device M2 and the width W1 of the MOS device M1 such that a ratio W1/L1(min) is significantly greater than a ratio W2/L2(max), the MOS devices M1 and M2 may be maintained in the sub-threshold operating region (e.g., L1(min)<L2(max), $V_{th1}<V_{th2}$, and $V_{gs1}=V_{gs2}<V_{th2}<V_{th2}$).

The MOS device M2 generally tracks the MOS device M1 by current over process, voltage, and temperature (PVT) variations. A difference between the gate-source voltage $V_{gs2}$ and the threshold voltage $V_{th2}$ (e.g., $V_{gs2}$ minus $V_{th2}$) generally does not vary too much (e.g., −213 mV to about −119 mV) over PVT variations. When the MOS devices M1 and M2 are operating in the sub-threshold operating region, the drain-source impedance (e.g., $R_{ds2}$) of the MOS device M2 may be greater than one MΩ over PVT (e.g., about 1.6 MΩ to about 2.97 MΩ for one device). In an example using 4 nm process technology, the MOS device M1 may be implemented having a gate length of 0.07 μm, sixteen fins, and twenty fingers, and the MOS device M2 may be implemented having a gate length of 0.2 μm and four fins. In an example, the MOS device M2 may be implemented comprising four MOS devices, each having a gate length of 0.2 μm and four fins, connected in series (e.g., to reach a total resistance of ~6 MΩ).

Figure 4A:
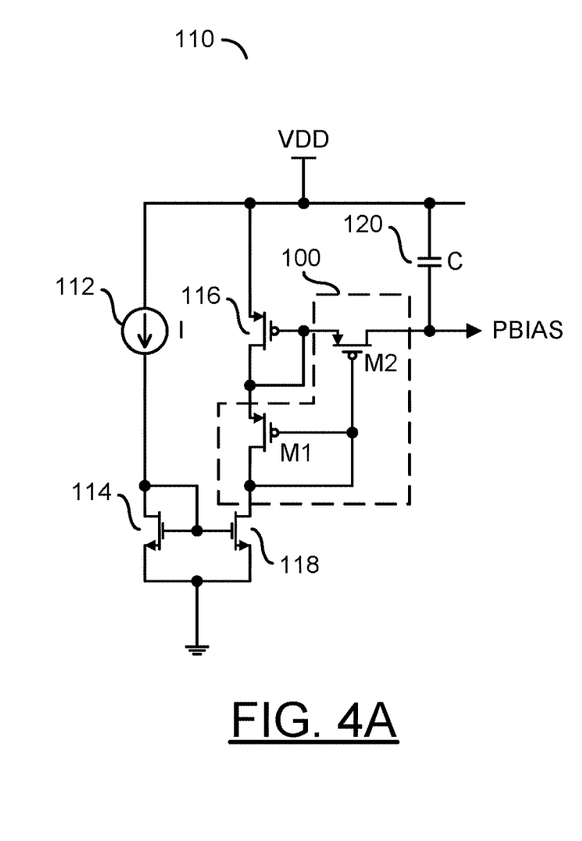
FIGS. 4A-4C are diagrams illustrating bias voltage and reference voltage generating circuits using an adaptive-bias metal-oxide-semiconductor (MOS) device in accordance with embodiments of the invention and a capacitor as a low-pass RC filter.
Figure 4B:
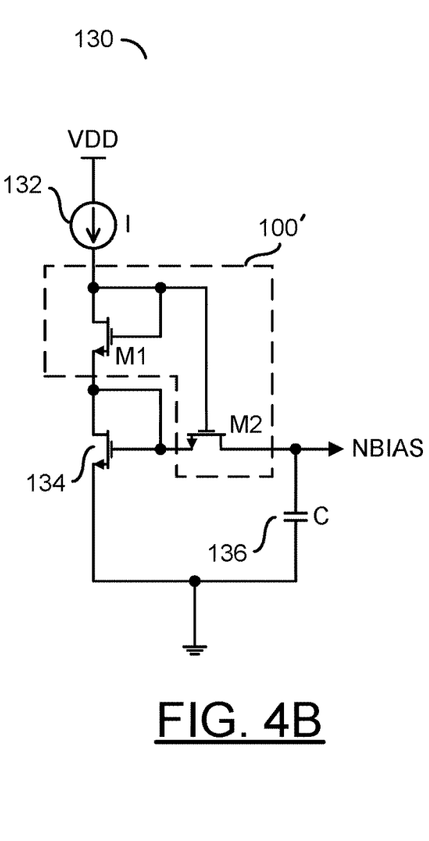
Figure 4C:
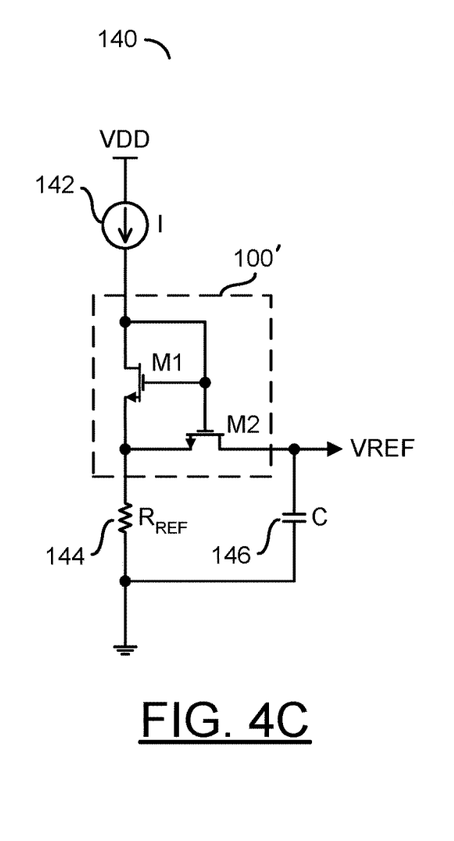

Referring to FIGS. 4A-4C, diagrams are shown illustrating bias voltage and reference voltage generating circuits using an adaptive-bias metal-oxide-semiconductor (MOS) device in accordance with an embodiment of the invention and a capacitor as a low-pass RC filter. In an example, a circuit 110 (FIG. 4A) may be implemented to generate a p-channel bias voltage (e.g., PBIAS), a circuit 130 (FIG. 4B) may be implemented to generate a n-channel bias voltage (e.g., NBIAS), and a circuit 140 (FIG. 4C) may be implemented to generate a reference voltage (e.g., VREF). In an example, the circuit 110, the circuit 130, and the circuit 140 may include a resistive-capacitive (RC) filter to filter supply and device noise. To filter supply and device noise with a frequency greater than 16 kHz, a large value capacitance (e.g., C=~10 pF) and a large value resistance (e.g., R>1 MΩ) are needed. In various embodiments, the circuit 110, the circuit 130, and the circuit 140 may replace a resistor of the RC filter with an adaptive-bias metal-oxide-semiconductor (MOS) device in accordance with an embodiment of the invention to significantly reduce die area occupied by the RC filter. In various embodiments, the resistance is provided by the drain-source impedance $R_{ds2}$ of the respective second MOS device M2 of the circuits 100 and 100'.

Referring to FIG. 4A, the circuit 110 may comprise the adaptive-bias MOS device 100, a current source 112, an n-channel metal-oxide-semiconductor (NMOS) transistor 114, a p-channel metal-oxide-semiconductor (PMOS) transistor 116, an NMOS transistor 118, and a capacitor 120. The current source 112 may be configured to generate a current (e.g., I). The transistor 114 and the transistor 118 may be configured as a current mirror. The transistor 118 generally mirrors the current I received by the transistor 114 from the current source 112. The transistor 116 may generate the bias voltage PBIAS having a level that corresponds to the transistor 116 having a drain current (e.g., $I_d$) equal to the current I mirrored by the transistor 118. The adaptive-bias MOS device 100 and the capacitor 120 are generally configured to implement a low-pass RC filter. In an example, the adaptive-bias MOS device 100 may present a large drain-source impedance (e.g., $R_{ds}$>1 MΩ) and the capacitor 120 may be implemented as a large capacitance (e.g., C=~10 pF) to filter supply and device noise with a frequency greater than 16 kHz.

In an example, the supply voltage VDD may be presented to an input of the current source 112, a source terminal of the transistor 116, and a first terminal of the capacitor 120. An output of the current source 112, may be connected to a drain terminal of the transistor 114, a gate terminal of the transistor 114, and a gate terminal of the transistor 118. A source terminal of the transistor 114 and a source terminal of the transistor 118 may be connected to the circuit ground potential. A drain terminal of the transistor 116, may be connected to a first terminal of the adaptive-bias MOS device 100 and a gate terminal of the transistor 116. A second terminal of the adaptive-biased MOS device 100 may be connected to a drain terminal of the transistor 118. A third terminal of the adaptive-biased MOS device 100 and a second terminal of the capacitor 120 may be connected to form a node at which the signal PBIAS may be presented.

Referring to FIG. 4B, the circuit 130 may comprise the adaptive-biased MOS device 100', a current source 132, an NMOS transistor 134, and a capacitor 136. The current source 132 may be configured to generate a current (e.g., I). The NMOS transistor 134 may be configured to generate the voltage NBIAS in response to the current I provided by the current source 132. The adaptive-biased MOS device 100' and the capacitor 136 are generally configured to implement a low-pass RC filter. In an example, the adaptive-biased MOS device 100' may present a large drain-source impedance (e.g., $R_{ds}>1$ MΩ) and the capacitor 136 may be implemented as a large capacitance (e.g., $C=\sim10$ pF) to filter supply and device noise with a frequency greater than 16 kHz. In various embodiments, the circuit 130 may replace a resistor of the RC filter with the adaptive-bias MOS device 100' in accordance with an embodiment of the invention to significantly reduce die area occupied by the RC filter.

In an example, the supply voltage VDD may be presented to an input of the current source 132. An output of the current source 132 may be connected to a first terminal of the adaptive-biased MOS device 100'. A second terminal of the adaptive-biased MOS device 100' may be connected to a drain terminal and a gate terminal of the transistor 134. A source terminal of the transistor 134 and a first terminal of the capacitor 136 may be connected to the circuit ground potential. A third terminal of the adaptive-biased MOS device 100' and a second terminal of the capacitor 136 may be connected to form a node at which the signal NBIAS may be presented.

Referring to FIG. 4C, the circuit 140 may comprise the adaptive-biased MOS device 100', a current source 142, a resistor 144, and a capacitor 146. The current source 142 is generally configured to generate a current (e.g., I). In an example, the current source 142 may be implemented as a bandgap-based current source. The resistor 144 may be implemented having a resistance value $R_{REF}$. The resistance value $R_{REF}$ of the resistor 144 is generally configured to generate the reference voltage VREF in response to the current I provided by the current source 142 (e.g., VREF=$IR_{REF}$). The current I provided by the current source 142 generally follows process variations of the resistor 144 such that VREF=$IR_{REF}$ is constant. The adaptive-biased MOS device 100' and the capacitor 146 are generally configured to implement a low-pass RC filter. In an example, the adaptive-biased MOS device 100' may present a large drain-source impedance (e.g., $R_{ds}>1$ MΩ) and the capacitor 146 may be implemented as a large capacitance (e.g., $C=\sim10$ pF) to filter supply and device noise with a frequency greater than 16 kHz. In various embodiments, the circuit 140 may replace a resistor of the RC filter with the adaptive-bias MOS device 100' in accordance with an embodiment of the invention to significantly reduce die area occupied by the RC filter.

In an example, the supply voltage VDD may be presented to an input of the current source 142. An output of the current source 142 may be connected to a first terminal of the adaptive-biased MOS device 100'. A second terminal of the adaptive-biased MOS device 100' may be connected to a first terminal of the resistor 144. A second terminal of the resistor 144 and a first terminal of the capacitor 146 may be connected to the circuit ground potential. A third terminal of the adaptive-biased MOS device 100' and a second terminal of the capacitor 146 may be connected to form a node at which the signal VREF may be presented.

Figure 5:
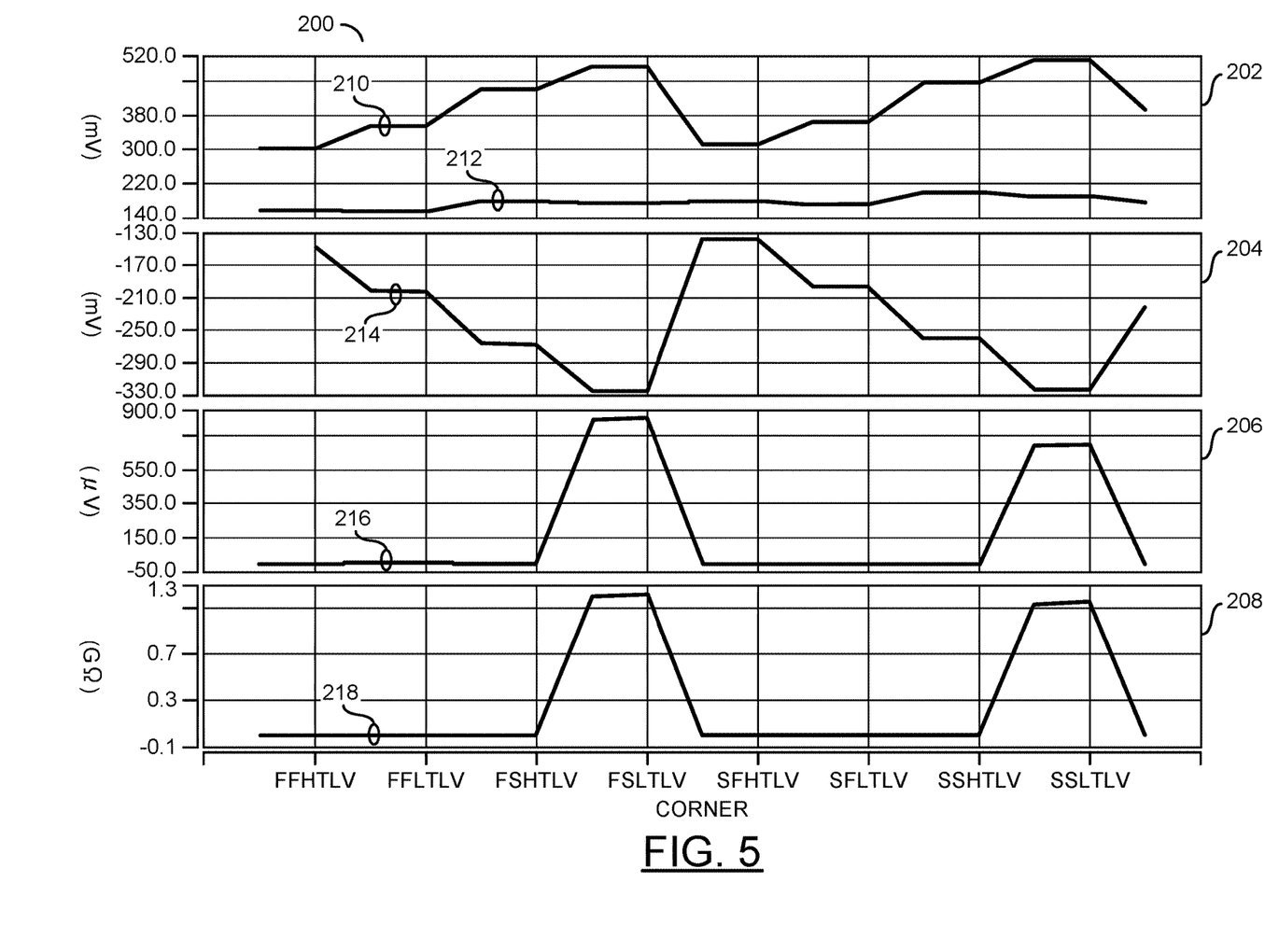
FIG. 5 is a diagram illustrating voltage levels of the circuit of FIG. 2A at a variety of process, voltage, and temperature corners.

Referring to FIG. 5, a diagram 200 is shown illustrating voltage and resistance parameters of the circuit 40' of FIG. 2A at a variety of process, voltage, and temperature corners. In an example, simulation results are shown illustrating the threshold voltage $V_{th}$, the gate-source voltage $V_{gs}$, the sub-threshold region gs-$V_{th}$, the drain-source voltage $V_{ds}$, and the drain-source impedance $R_{ds}$ of the transistor 49 at a variety of process, voltage, and temperature corners. In an example, the variety of process, voltage, and temperature corners simulated may be summarized in the following Table 1:

TABLE 1

| Corner | VDD (V) | Temp. (° C.) | FEOL Corner |
|---|---|---|---|
| FFHTHV | 1.312 | 125 | Fast |
| FFHTLV | 1.188 | 125 | Fast |
| FFLTHV | 1.312 | −40 | Fast |
| FFLTLV | 1.188 | −40 | Fast |
| FSHTHV | 1.312 | 125 | FS |
| FSHTLV | 1.188 | 125 | FS |
| FSLTHV | 1.312 | −40 | FS |
| FSLTLV | 1.188 | −40 | FS |
| SFHTHV | 1.312 | 125 | SF |
| SFHTLV | 1.188 | 125 | SF |
| SFLTHV | 1.312 | −40 | SF |
| SFLTLV | 1.188 | −40 | SF |
| SSHTHV | 1.312 | 125 | Slow |
| SSHTLV | 1.188 | 125 | Slow |
| SSLTHV | 1.312 | −40 | Slow |
| SSLTLV | 1.188 | −40 | Slow |
| TTNTNV | 1.25 | 85 | Typical |

A graph 202 is shown illustrating the threshold voltage $V_{th}$ and the gate-source voltage $V_{gs}$ of the transistor 49 at the variety of process, voltage, and temperature corners. A graph 204 is shown illustrating a difference (e.g., $V_{gs}-V_{th}$, or sub-threshold region) between the threshold voltage $V_{th}$ and the gate-source voltage $V_{gs}$ of the transistor 49 at the variety of process, voltage, and temperature corners. A graph 206 illustrates the drain-source voltage $V_{ds}$ of the transistor 49 over the variety of process, voltage, and temperature corners. A graph 208 illustrates the drain-source impedance $R_{ds}$ of the transistor 49 over the variety of process, voltage, and temperature corners.

A curve 210 illustrates values of the threshold voltage $V_{th}$ of the transistor 49 at the variety of process, voltage, and temperature corners. A curve 212 illustrates values of the gate-source voltage $V_{gs}$ of the transistor 49 at the variety of process, voltage, and temperature corners. A curve 214 illustrates the difference between the threshold voltage $V_{th}$ and the gate-source voltage $V_{gs}$ of the transistor 49 at the variety of process, voltage, and temperature corners. A curve 216 illustrates values of the drain-source voltage $V_{ds}$ of the transistor 49 at the variety of process, voltage, and temperature corners. A curve 218 illustrates values of the drain-source impedance $R_{ds}$ of the transistor 49 at the variety of process, voltage, and temperature corners.

Figure 6:
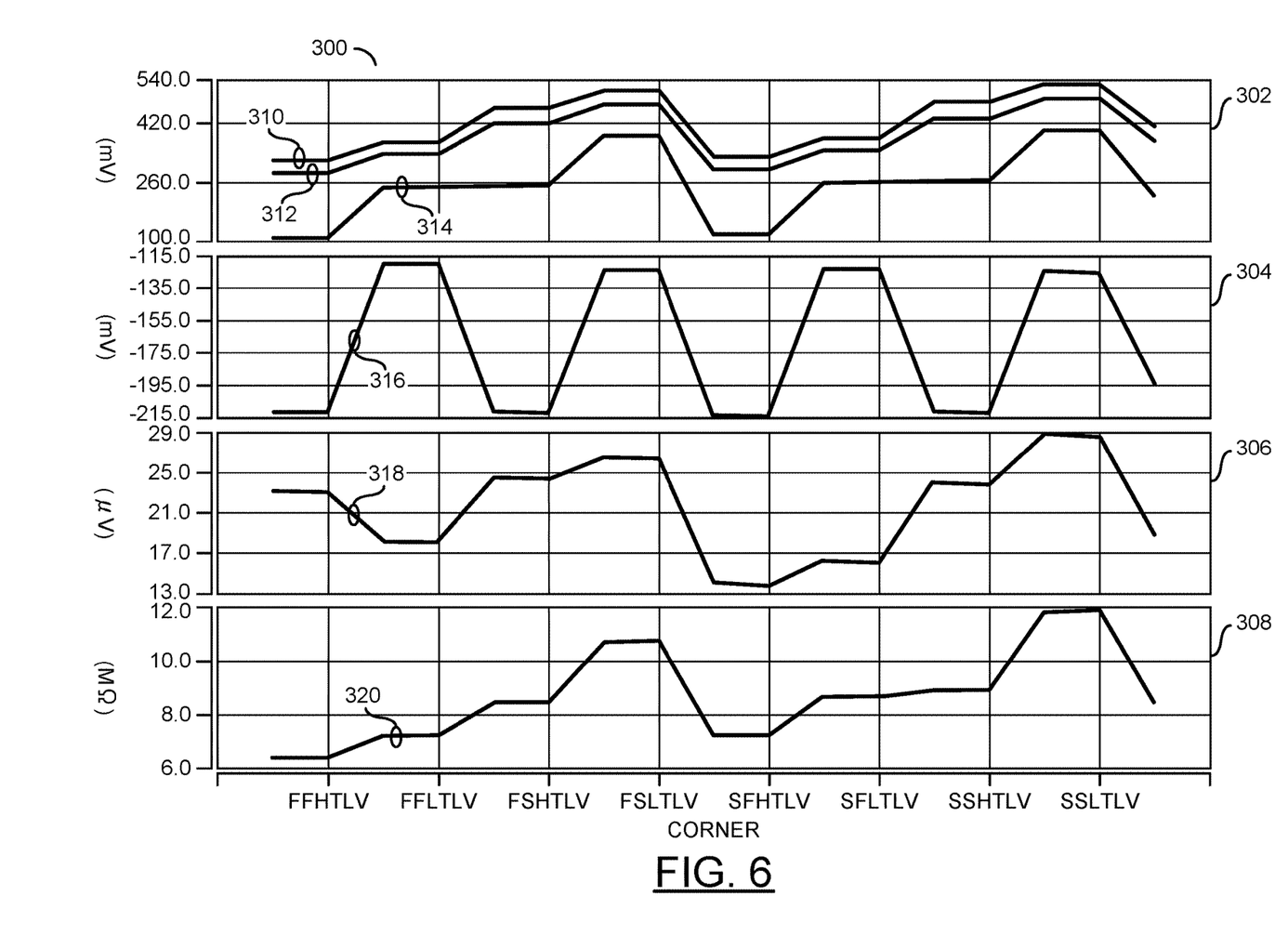
FIG. 6 is a diagram illustrating voltage levels of the circuit of FIG. 4A at a variety of process, voltage, and temperature corners.

Referring to FIG. 6, a diagram 300 is shown illustrating voltage and resistance parameters of the circuit 100 of FIG. 4A at a variety of process, voltage, and temperature corners. In an example, simulation results are shown illustrating the threshold voltage $V_{th}$, the gate-source voltage $V_{gs}$, the sub-threshold region $V_{gs}-V_{th}$, the drain-source voltage $V_{ds}$, and the drain-source impedance $R_{ds}$ of the MOS devices M1 and M2 at the variety of process, voltage, and temperature corners listed in Table 1 above. A graph 302 is shown illustrating a threshold voltages and gate-source voltages of the MOS devices M1 and M2 at the variety of process, voltage, and temperature corners summarized in Table 1 above. A graph 304 is shown illustrating a difference between the threshold voltage $V_{th2}$ and the gate-source voltage $V_{gs2}$ of the MOS device M2 at the variety of process, voltage, and temperature corners. A graph 306 illustrates the drain-source voltage $V_{ds}$ of the MOS device M2 at the variety of process, voltage, and temperature corners. A graph 308 illustrates the drain-source impedance $R_{ds}$ of the MOS device M2 at the variety of process, voltage, and temperature corners.

A curve 310 illustrates values of the threshold voltage $V_{th2}$ of the MOS device M2 at the variety of process, voltage, and temperature corners. A curve 312 illustrates values of the threshold voltage $V_{th1}$ of the MOS device M1 at the variety of process, voltage, and temperature corners. A curve 314 illustrates values of the gate-source voltage $V_{gs}$ of the MOS devices M1 and M2 at the variety of process, voltage, and temperature corners. A curve 316 illustrates the difference between the threshold voltage $V_{th2}$ and the gate-source voltage $V_{gs2}$ of the MOS device M2 at the variety of process, voltage, and temperature corners. A curve 318 illustrates values of the drain-source voltage $V_{ds}$ of the MOS device M2 at the variety of process, voltage, and temperature corners. A curve 320 illustrates values of the drain-source impedance $R_{ds}$ of the MOS device M2 at the variety of process, voltage, and temperature corners.

Figure 7:
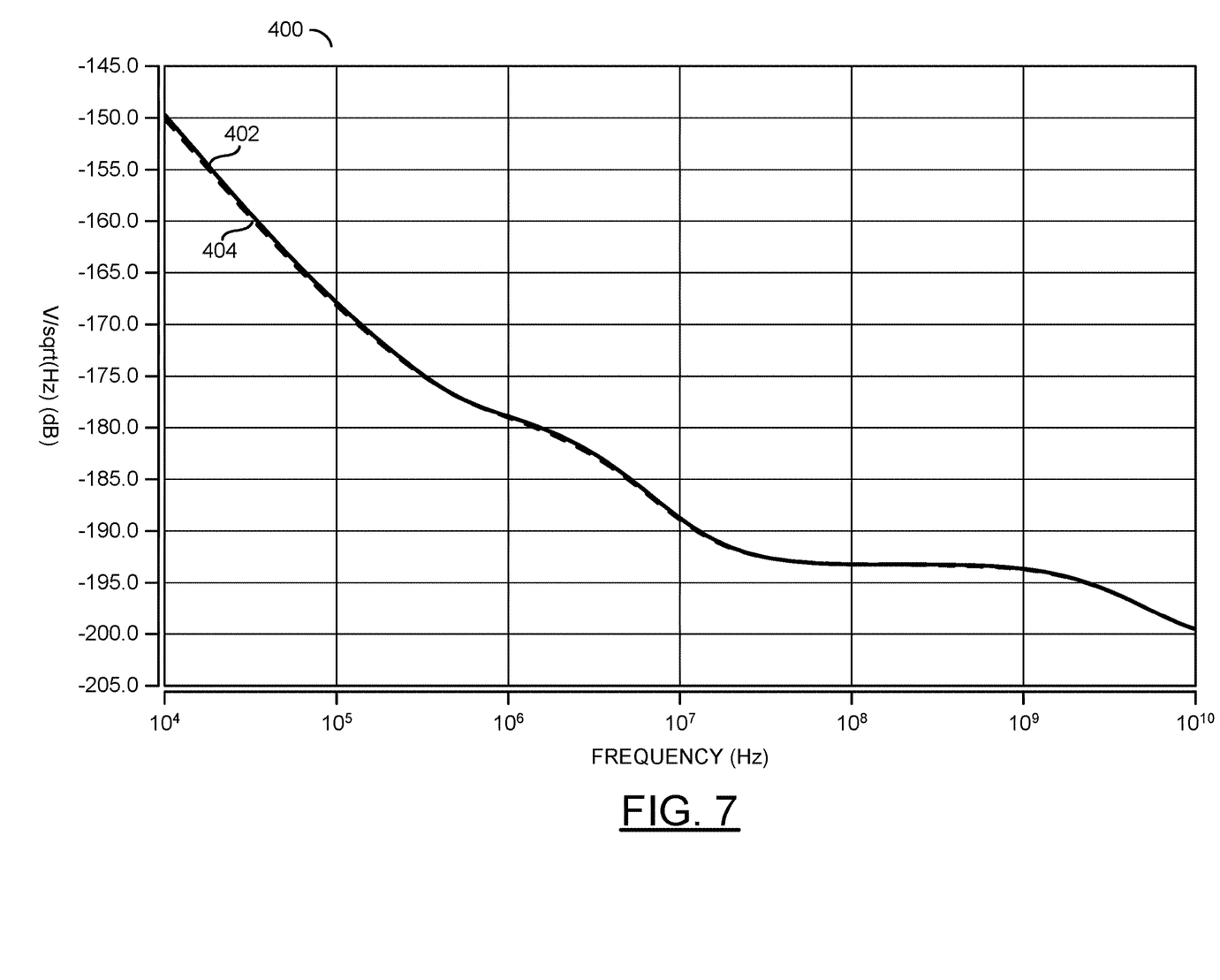
FIG. 7 is a diagram illustrating a comparison of output noise performance between the circuit of FIG. 1A and the circuit of FIG. 4A.

Referring to FIG. 7, a diagram of a graph 400 is shown illustrating a simulation comparing output noise performance between the circuit 40 of FIG. 1A and the circuit 110 of FIG. 4A. A curve 402 illustrates output noise performance of the circuit 40 of FIG. 1A. A curve 404 illustrates output noise performance of the circuit 110 of FIG. 4A. As may be seen, both the RC filter and the filter comprising the adaptive-bias MOS device and a capacitor may filter an equivalent amount of device noise and have substantially similar output noise performance. Thus, the adaptive-bias MOS device in accordance with an embodiment of the invention may replace the large value resistor in an RC filter and achieve a significant savings in chip area, while maintaining performance.

Figure 8:
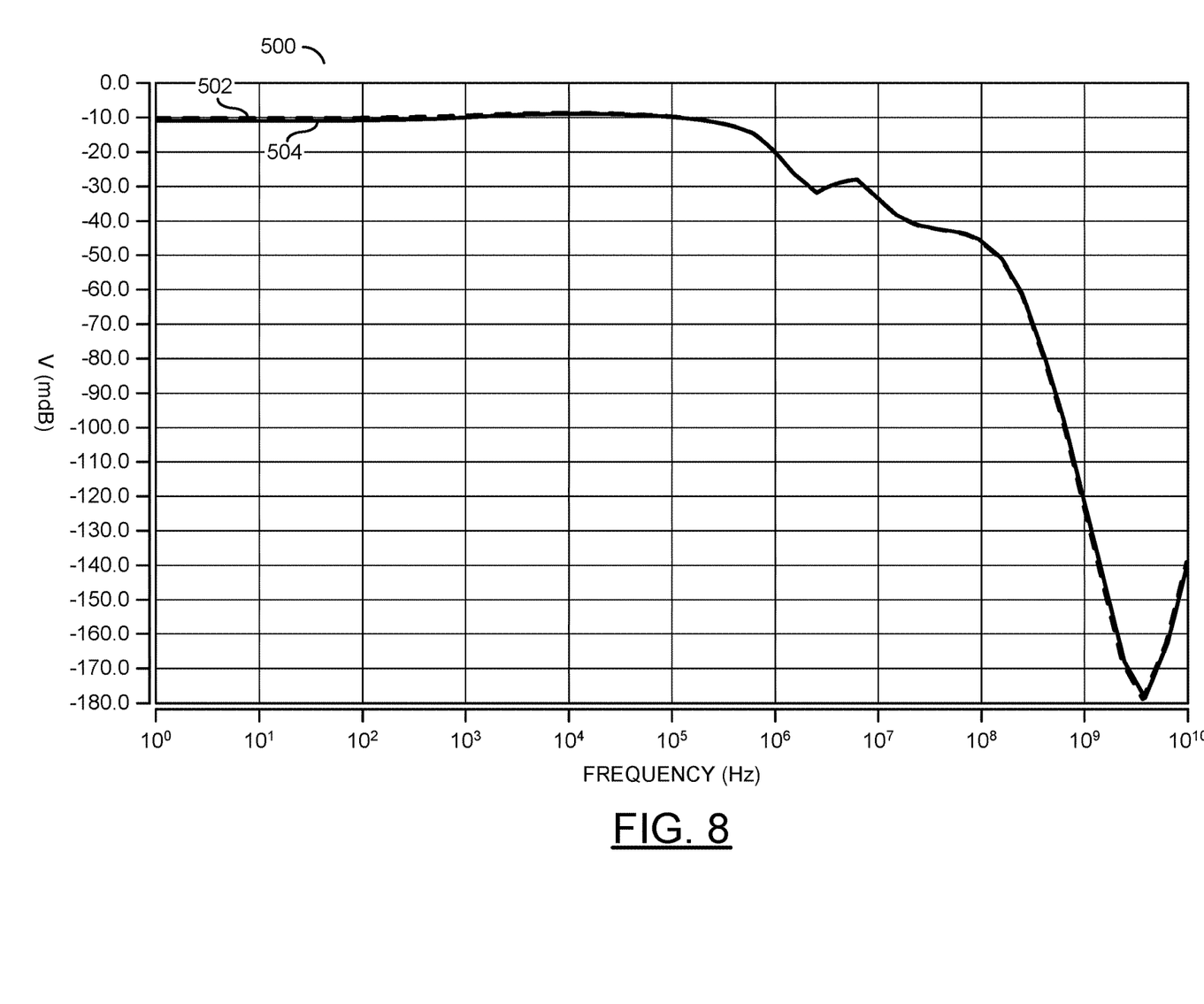
FIG. 8 is a diagram illustrating a comparison of power supply noise filtering performance between the circuit of FIG. 1A and the circuit of FIG. 4A.

Referring to FIG. 8, a diagram of a graph 500 is shown illustrating a comparison of power supply noise filtering performance between the circuit 40 of FIG. 1A and the circuit 110 of FIG. 4A. A curve 502 illustrates a simulation of power supply noise filtering performance of the circuit 40 of FIG. 1A. A curve 504 illustrates a simulation of power supply noise filtering performance of the circuit 110 of FIG. 4A. As may be seen, both the RC filter and the filter comprising the adaptive-bias MOS device and a capacitor may filter an equivalent amount of device noise and have substantially similar output noise performance. Thus, the adaptive-bias MOS device in accordance with an embodiment of the invention may replace the large value resistor in an RC filter and achieve a significant savings in chip area, while maintaining performance.

The terms "may" and "generally" when used herein in conjunction with "is (are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The designations of various components, modules and/or circuits as "a"-"n", when used herein, disclose either a singular component, module and/or circuit or a plurality of such components, modules and/or circuits, with the "n" designation applied to mean any particular integer number. Different components, modules and/or circuits that each have instances (or occurrences) with designations of "a"-"n" may indicate that the different components, modules and/or circuits may have a matching number of instances or a different number of instances. The instance designated "a" may represent a first of a plurality of instances and the instance "n" may refer to a last of a plurality of instances, while not implying a particular number of instances.

While the invention has been particularly shown and described with reference to embodiments thereof, it will be understood by those skilled in the art that various changes in form and details may be made without departing from the scope of the invention.

The invention claimed is:

1. An adaptive-bias metal-oxide-semiconductor (MOS) device comprising:
 a first terminal;
 a second terminal;
 a third terminal;
 a first MOS device; and
 a second MOS device, wherein
  the first MOS device has a first width and a first gate length,
  the second MOS device has a second width and a second gate length,
  the first terminal is connected to a first source terminal of the first MOS device and a second source terminal of the second MOS device,
  the second terminal is connected to a first drain terminal of the first MOS device, a first gate terminal of the first MOS device, and a second gate terminal of the second MOS device,
  the third terminal is connected to a second drain terminal of the second MOS device, and
  the first MOS device and the second MOS device are configured to operate in a sub-threshold operating region, wherein a first gate-source voltage of the first MOS device and a second gate-source voltage of the second MOS device are less than a first threshold voltage of the first MOS device and the first threshold voltage of the first MOS device is less than a second threshold voltage of the second MOS device.

2. The adaptive-bias metal-oxide-semiconductor (MOS) device according to claim 1, wherein a first ratio of the first width to the first gate length is substantially greater than a second ratio of the second width to the second gate length.

3. The adaptive-bias metal-oxide-semiconductor (MOS) device according to claim 1, wherein the first gate length is a minimum gate length and the second gate length is a maximum gate length.

4. The adaptive-bias metal-oxide-semiconductor (MOS) device according to claim 1, wherein the second MOS device presents a high source-drain impedance.

5. The adaptive-bias metal-oxide-semiconductor (MOS) device according to claim 1, wherein the first MOS device is configured to maintain the second gate-source voltage of the second MOS device below the second threshold voltage of the second MOS device such that the second MOS device presents a source-drain impedance greater than or equal to a megaohm.

6. The adaptive-bias metal-oxide-semiconductor (MOS) device according to claim 1, wherein the second MOS device comprises a plurality of MOS field effect transistors connected in series.

7. The adaptive-bias metal-oxide-semiconductor (MOS) device according to claim 1, wherein the first MOS device and the second MOS device comprise p-channel MOS field effect transistors.

8. The adaptive-bias metal-oxide-semiconductor (MOS) device according to claim 1, wherein the first MOS device and the second MOS device comprise n-channel MOS field effect transistors.

9. A method of implementing a reference voltage generating circuit having a reduced-area resistive-capacitive (RC) filter on an integrated circuit comprising:
connecting an output of a voltage generating circuit to a first terminal and a second terminal of an adaptive-bias metal-oxide-semiconductor (MOS) device;
connecting a third terminal of said adaptive-bias metal-oxide-semiconductor (MOS) device to a first terminal of a capacitor; and
connecting a second terminal of said capacitor to at least one of a supply voltage of said voltage generating circuit and a ground potential of said voltage generating circuit, wherein
said adaptive-bias metal-oxide-semiconductor (MOS) device and said capacitor are configured as a resistive-capacitive filter of said voltage generating circuit, and
said adaptive-bias metal-oxide-semiconductor (MOS) device comprises said first terminal, said second terminal, said third terminal, a first MOS device, and a second MOS device, the first MOS device has a first width and a first gate length, the second MOS device has a second width and a second gate length, the first terminal is connected to a first source terminal of the first MOS device and a second source terminal of the second MOS device, the second terminal is connected to a first drain terminal of the first MOS device, a first gate terminal of the first MOS device, and a second gate terminal of the second MOS device, the third terminal is connected to a second drain terminal of the second MOS device, and the first MOS device and the second MOS device are configured to operate in a sub-threshold operating region.

10. An apparatus comprising:
an adaptive-bias metal-oxide-semiconductor (MOS) device; and
a capacitor, wherein
said adaptive-bias metal-oxide-semiconductor (MOS) device and said capacitor are configured as a resistive-capacitive filter of a voltage generating circuit, and
said adaptive-bias metal-oxide-semiconductor (MOS) device comprises a first terminal, a second terminal, a third terminal, a first MOS device, and a second MOS device, the first MOS device has a first width and a first gate length, the second MOS device has a second width and a second gate length, the first terminal is connected to a first source terminal of the first MOS device and a second source terminal of the second MOS device, the second terminal is connected to a first drain terminal of the first MOS device, a first gate terminal of the first MOS device, and a second gate terminal of the second MOS device, the third terminal is connected to a second drain terminal of the second MOS device, and the first MOS device and the second MOS device are configured to operate in a sub-threshold operating region.

11. The apparatus according to claim 10, wherein a first ratio of the first width to the first gate length is substantially greater than a second ratio of the second width to the second gate length.

12. The apparatus according to claim 10, wherein the first gate length is a minimum gate length and the second gate length is a maximum gate length.

13. The apparatus according to claim 10, wherein a first gate-source voltage of the first MOS device and a second gate-source voltage of the second MOS device are less than a first threshold voltage of the first MOS device and the first threshold voltage of the first MOS device is less than a second threshold voltage of the second MOS device.

14. The apparatus according to claim 10, wherein the second MOS device presents a high source-drain impedance.

15. The apparatus according to claim 10, wherein the first MOS device is configured to maintain a second gate-source voltage of the second MOS device below a second threshold voltage of the second MOS device such that the second MOS device presents a source-drain impedance greater than or equal to a megaohm.

16. The apparatus according to claim 10, wherein the second MOS device comprises a plurality of MOS field effect transistors connected in series.

17. The apparatus according to claim 10, wherein the first MOS device and the second MOS device comprise p-channel MOS field effect transistors.

18. The apparatus according to claim 10, wherein the first MOS device and the second MOS device comprise n-channel MOS field effect transistors.

19. The apparatus according to claim 10, wherein the apparatus comprises at least one of a reference voltage generating circuit and a bias voltage generating circuit on an integrated circuit.

* * * * *